(12) United States Patent
Lin et al.

(10) Patent No.: US 12,218,189 B2
(45) Date of Patent: Feb. 4, 2025

(54) SEMICONDUCTOR DEVICE AND METHOD FOR MANUFACTURING THE SAME

(71) Applicant: TAIWAN SEMICONDUCTOR MANUFACTURING COMPANY, LTD., Hsinchu (TW)

(72) Inventors: Hsin-Fu Lin, Hsinchu (TW); Tsung-Hao Yeh, Hsinchu (TW); Chih-Wei Hung, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 0 days.

(21) Appl. No.: 18/518,797

(22) Filed: Nov. 24, 2023

(65) Prior Publication Data

US 2024/0088213 A1    Mar. 14, 2024

Related U.S. Application Data

(62) Division of application No. 17/319,457, filed on May 13, 2021, now Pat. No. 11,862,670.

(51) Int. Cl.
*H01L 29/06*    (2006.01)
*H01L 29/66*    (2006.01)
*H01L 29/78*    (2006.01)

(52) U.S. Cl.
CPC .... *H01L 29/0607* (2013.01); *H01L 29/66681* (2013.01); *H01L 29/7816* (2013.01)

(58) Field of Classification Search
CPC ............. H01L 29/7816; H01L 29/7817; H01L 29/7818; H01L 29/7819; H01L 29/782; H01L 29/7821; H01L 29/7823; H01L 29/7824; H01L 29/7825; H01L 29/7826; H01L 29/66681; H01L 29/66689; H01L 29/66696; H01L 29/66704
See application file for complete search history.

(56) References Cited

U.S. PATENT DOCUMENTS

| | | | |
|---|---|---|---|
| 2012/0037988 A1* | 2/2012 | Hao | H01L 29/66659 257/E29.256 |
| 2014/0179079 A1* | 6/2014 | Huang | H01L 29/0619 438/286 |
| 2017/0213893 A1* | 7/2017 | Edwards | H01L 21/823462 |
| 2020/0043801 A1* | 2/2020 | Kim | H01L 29/0878 |
| 2022/0005949 A1* | 1/2022 | Chen | H01L 29/0869 |
| 2022/0223733 A1* | 7/2022 | Chang | H01L 29/7817 |

* cited by examiner

*Primary Examiner* — Raj R Gupta
(74) *Attorney, Agent, or Firm* — Birch, Stewart, Kolasch & Birch, LLP

(57) ABSTRACT

A semiconductor device includes a drift region, a dielectric film, and an anti-type doping layer. The drift region has a first type conductivity. The anti-type doping layer is located between the drift region and the dielectric film, and has a second type conductivity opposite to the first type conductivity so as to change a current path of a current in the drift region, to thereby prevent the current from being influenced by the dielectric film. A method for manufacturing a semiconductor device and a method for reducing an influence of a dielectric film are also disclosed.

20 Claims, 15 Drawing Sheets

SEMICONDUCTOR DEVICE AND METHOD FOR MANUFACTURING THE SAME

REFERENCE TO RELATED APPLICATION

This application is a divisional application of U.S. patent application Ser. No. 17/319,457, filed on May 13, 2021, the content of which is incorporated herein by reference in its entirety.

BACKGROUND

In semiconductor devices, such as metal oxide semiconductor field effect transistors (MOSFETs), severe hot carriers may degrade reliability, induce high leakage current, or cause malfunction of the MOSFETs. Hence, there is a need to solve this problem.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
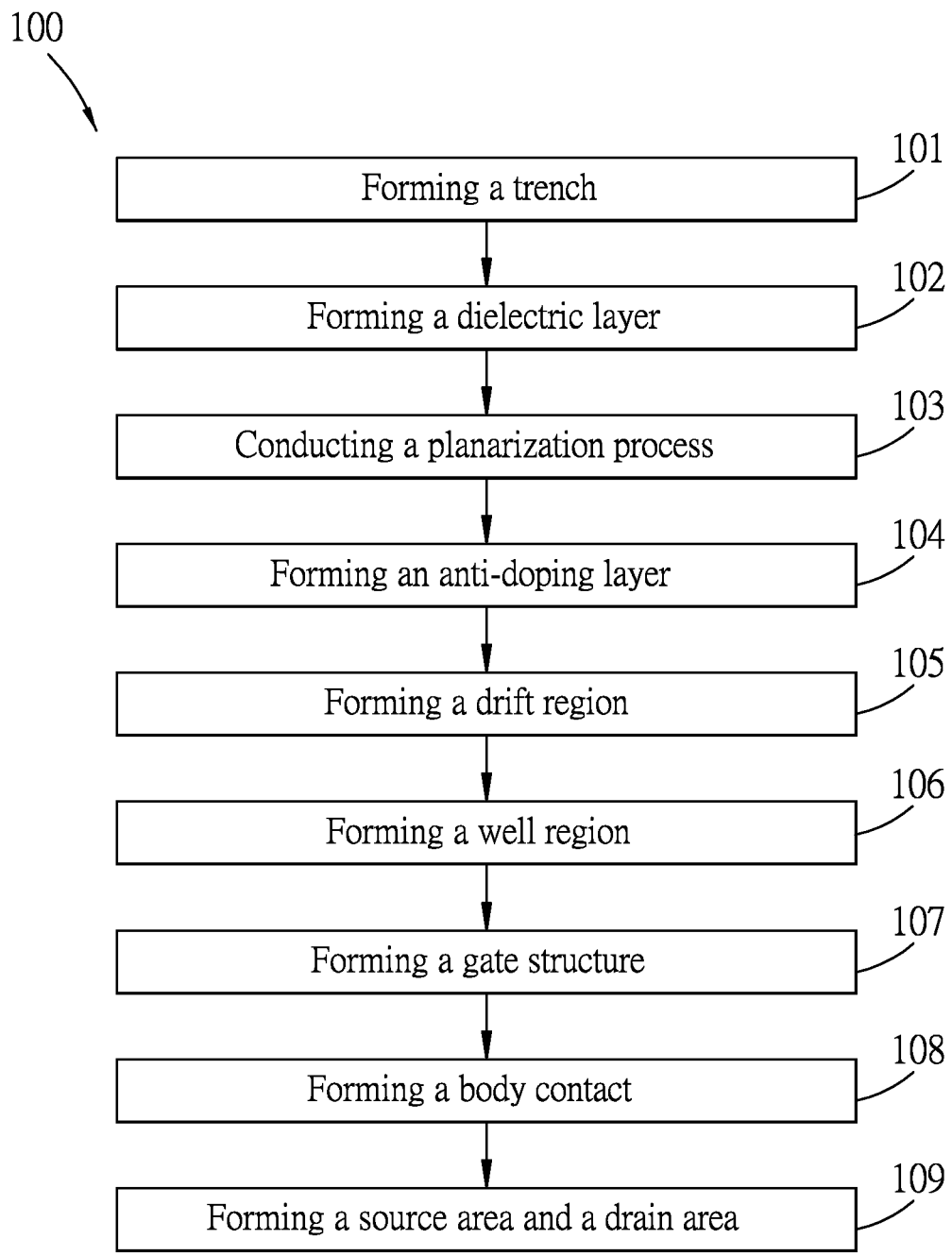
FIG. 1 is a flow diagram illustrating a method for manufacturing a semiconductor device in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "over," "underneath," "beneath," "proximate," "distal," "lower," "higher," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to semiconductor devices and methods for manufacturing the same. The semiconductor devices may be power MOSFETs, which may be bipolar, complementary metal-oxide semiconductor (CMOS) diffusion metal-oxide semiconductor (DMOS) devices (bipolar-CMOS-DMOS (BCD) devices), for example, but not limited to, LDMOS transistors (lateral diffused metal oxide semiconductor field effect transistors) or other suitable transistors/power devices.

FIG. 1 is a flow diagram illustrating a method 100 for manufacturing a semiconductor device in accordance with some embodiments. FIGS. 2 to 11 illustrate schematic views of the intermediate stages of the method 100.

Figure 2:
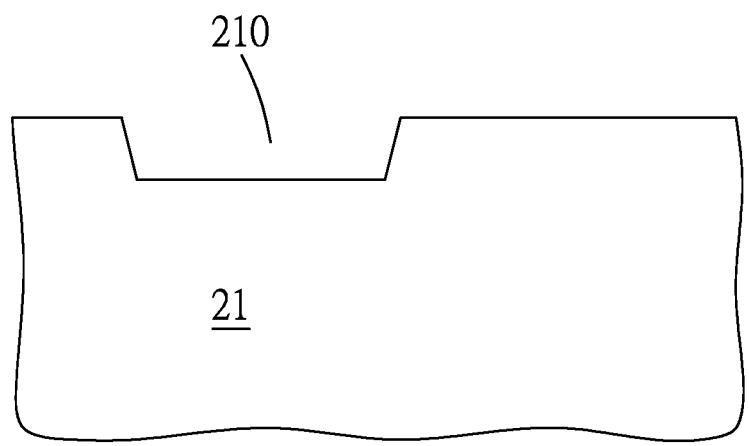
FIGS. 2 to 11 are schematic views illustrating intermediate stages of a method for manufacturing the semiconductor device in accordance with some embodiments as depicted in FIG. 1.

Referring to FIGS. 1 and 2, the method 100 begins at step 101, where a trench 210 is formed in a semiconductor layer 21. In some embodiments, the semiconductor layer 21 may include crystalline silicon, polycrystalline silicon, or a combination thereof. Other suitable semiconductor materials are within the contemplated scope of the present disclosure. The trench 210 may be formed using a photolithography process and an etching process. The photolithography process may include, for example, but not limited to, coating a photoresist (not shown), soft-baking, exposing the photoresist through a photomask, post-exposure baking, and developing the photoresist, followed by hard-baking so as to form a patterned photoresist on the semiconductor layer 21. The etching process may be implemented by etching the semiconductor layer 21 through the patterned photoresist using, for example, but not limited to, a dry etching process, a wet etching process, other suitable processes, or combinations thereof.

Figure 3:
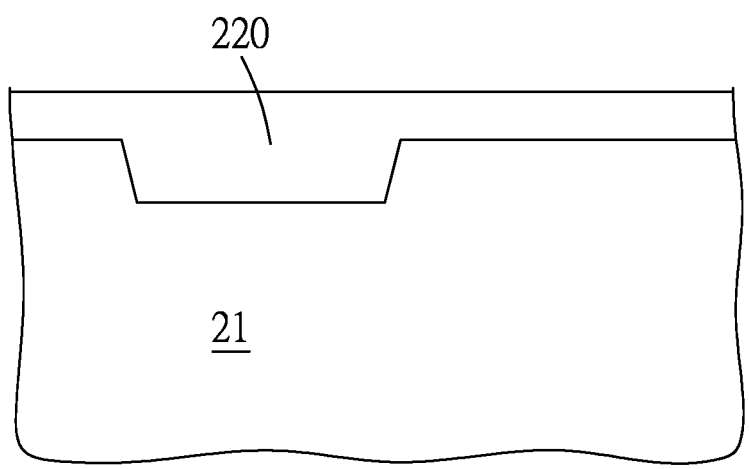

Referring to FIGS. 1 and 3, the method 100 proceeds to step 102, where a dielectric layer 220 is formed on the semiconductor layer 21 to fill the trench 210 shown in FIG. 2. The dielectric layer 220 may include, but not limited to, silicon oxide, silicon nitride, silicon oxynitride, or combinations thereof. Other suitable dielectric materials are within the contemplated scope of the present disclosure. The dielectric layer 220 may be deposited by, for example, but not limited to, sputtering, chemical vapor deposition (CVD), physical vapor deposition (PVD), or other suitable processes.

Figure 4:
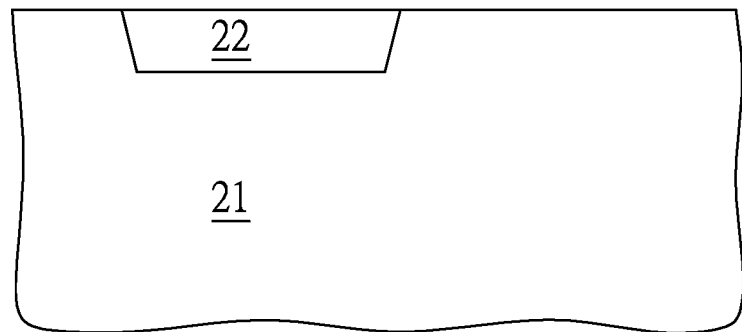

Referring to FIGS. 1 and 4, the method 100 proceeds to step 103, where a planarization process is conducted to remove an excess of the dielectric layer 220 shown in FIG. 3, to expose the semiconductor layer 21 so as to obtain a dielectric film 22. The dielectric film 22 may also be referred to as a shallow trench isolation (STI) region. Step 103 may be implemented using a chemical mechanical polishing (CMP) process or other suitable techniques. Other suitable processes may be used for formation of the STI region 22.

Figure 5:
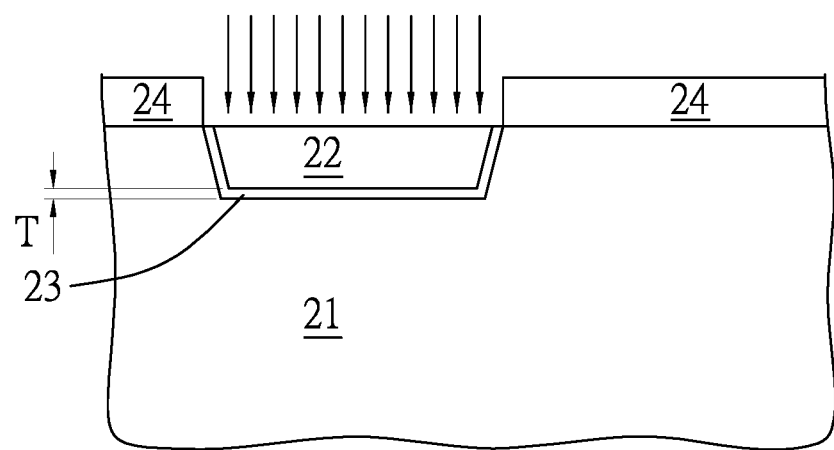

Referring to FIGS. 1 and 5, the method 100 proceeds to step 104, where an anti-type doping layer 23 is formed beneath the STI region 22. In some embodiments, the anti-type doping layer 23 may have a thickness (T) ranging from about 50 Å to about 200 Å, although a slightly larger or smaller thickness may be used based on the device performance or the designs of the product to be produced. Step 104 may be implemented by (i) forming a patterned mask 24 on the semiconductor layer 21 to expose the STI region 22 and a first surrounding surface of the semiconductor layer 21 around the STI region 22, and (ii) doping a region beneath the STI region 22 through the patterned mask 24 using an ion implantation process or other suitable processes so as to form the anti-type doping layer 23. After step 104, the patterned mask 24 may be removed. For an N-type MOS device, a P-type dopant is used in the ion implantation process for forming the anti-type doping layer 23 with a P-type conductivity, and may include, for example, but not limited to, boron, $BF_2$, indium, the like, or combinations thereof. For a P-type MOS device, an N-type dopant is used in the ion implantation process for forming the anti-type doping layer 23 with an N-type conductivity, and may include, for example, but not limited to, arsenic, phosphorus, the like, or combinations thereof. Other suitable P-type dopants and N-type dopants are within the contemplated scope of the present disclosure. In alternative embodiments, the patterned mask 24 may be replaced by a patterned photoresist. Other suitable processes may be used for formation of the anti-type doping layer 23.

Figure 6:
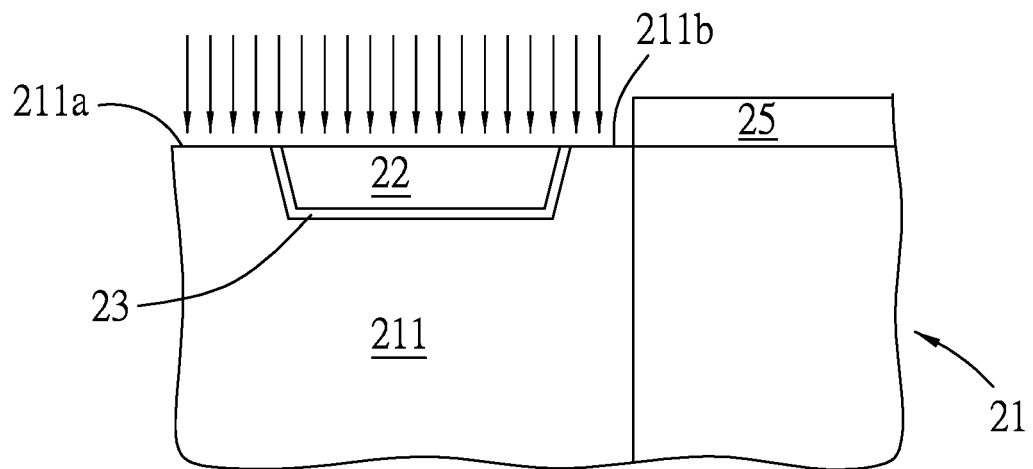

Referring to FIGS. 1 and 6, the method 100 proceeds to step 105, where a drift region 211 is formed in the semiconductor layer 21 to have a doping concentration lower than that of the anti-type doping layer 23. After step 105, the anti-type doping layer 23 is located between the drift region 211 and the STI region 22. Step 105 may be implemented by (i) forming a patterned mask 25 on the semiconductor layer 21 to expose the STI region 22 and a second surrounding surface of the semiconductor layer 21 around the STI region 22 and the anti-type doping layer 23, and (ii) doping the semiconductor layer 21 through the patterned mask 25 using an ion implantation process or other suitable processes so as to form the drift region 211. After step 105, the patterned mask 25 may be removed. In some embodiments, the drift region 211 has a first type conductivity, and the anti-type doping layer 23 has a second type conductivity opposite to the first type conductivity. Thus, the drift region 211 may be formed using the above-mentioned N-type dopant for forming the N-type MOS device, or using the above-mentioned P-type dopant for forming the P-type MOS device. In some embodiments, an upper surface of the drift region 211 (which corresponds to the second surrounding surface of the semiconductor layer 21 mentioned above) may have a first surface portion 211a and a second surface portion 211b which are located at two opposite sides of the STI region 22 and the anti-type doping layer 23. In alternative embodiments, the patterned mask 25 may be replaced by a patterned photoresist. Other suitable processes may be used for formation of the drift region 211. Please note that the term "anti-type doping layer" means a layer having a conductivity type opposite to that of the drift region 211.

Figure 7:
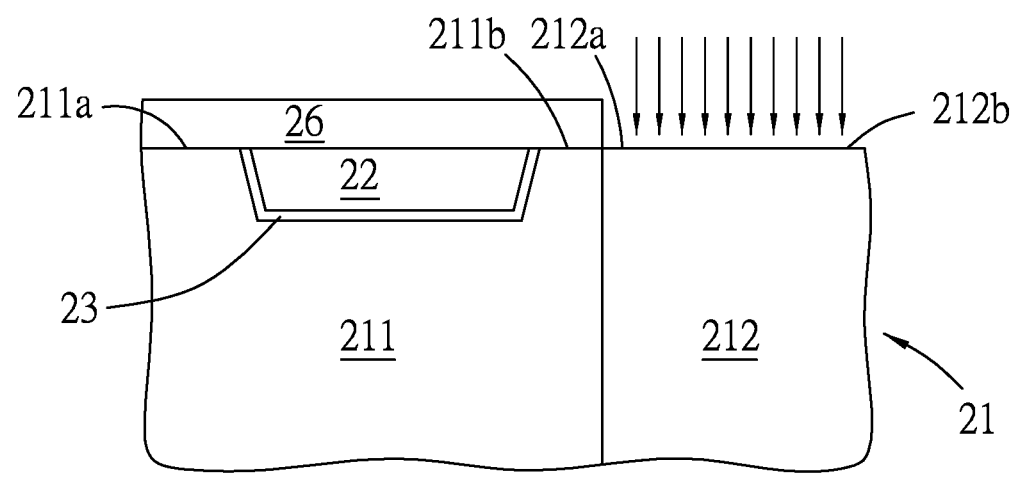

Referring to FIGS. 1 and 7, the method 100 proceeds to step 106, where a well region 212 is formed in the semiconductor layer 21. Step 106 may be implemented by (i) forming a patterned mask 26 on the semiconductor layer 21 to cover the STI region 22, the anti-type doping layer 23, and the drift region 211, and (ii) doping the semiconductor layer 21 through the patterned mask 26 using an ion implantation process or other suitable processes so as to form the well region 212. After step 106, the patterned mask 26 may be removed. In some embodiments, the well region 212 has the second type conductivity, and thus may be formed using the above-mentioned P-type dopant for forming the N-type MOS device, or using the above-mentioned N-type dopant for forming the P-type MOS device. In some embodiments, an upper surface of the well region 212 may have a first surface portion 212a and a second surface portion 212b which are proximate to and distal from the STI region 22, respectively. In alternative embodiments, the patterned mask 26 may be replaced by a patterned photoresist. Other suitable processes may be used for formation of the well region 212.

Figure 8:
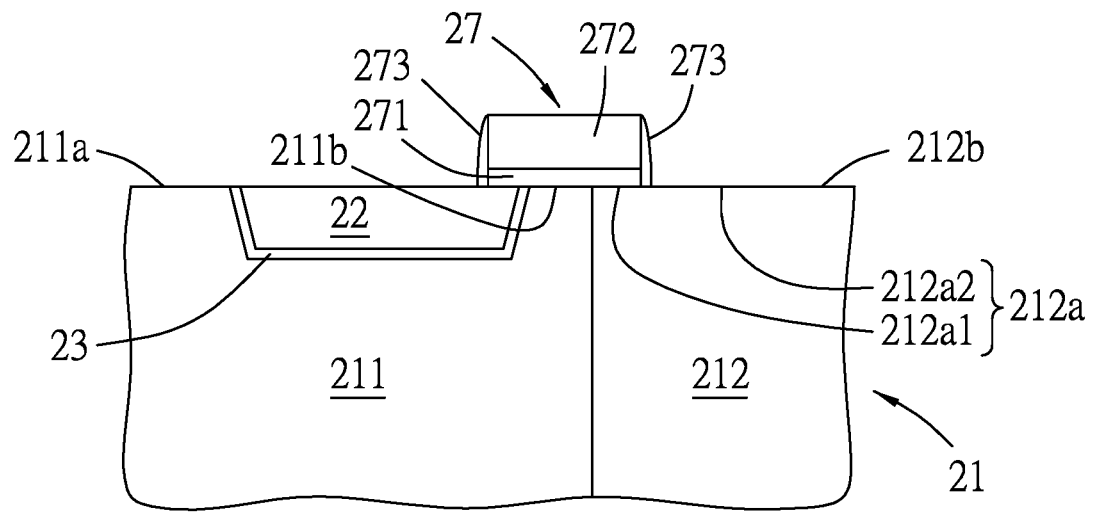

Referring to FIGS. 1 and 8, the method 100 proceeds to step 107, where a gate structure 27 is formed on the semiconductor layer 21. In some embodiments, the gate structure 27 includes a gate dielectric 271 formed on the semiconductor layer 21, a gate electrode 272 formed on the gate dielectric 271, and two spacers 273 formed at two opposite sides of a stack of the gate electrode 272 and the gate dielectric 271. The gate dielectric 271 may include, for example, but not limited to, silicon oxide, silicon oxynitride, silicon nitride, or combinations thereof. Other suitable gate dielectric materials are within the contemplated scope of the present disclosure. The gate electrode 272 may include, for example, but not limited to, a metallic material, a metal compound, polycrystalline silicon, or doped silicon. Other suitable gate materials are within the contemplated scope of the present disclosure. The metallic material may include, for example, but not limited to, silver, aluminum, copper, tungsten, nickel, other suitable materials, alloys thereof, or combinations thereof. The metal compound may include, for example, but not limited to, titanium nitride, tantalum nitride, metal silicide, other suitable materials, or combinations thereof. The spacers 273 may include, for example, but not limited to, silicon oxide, silicon oxynitride, silicon nitride, or combinations thereof. Other suitable spacer materials are within the contemplated scope of the present disclosure. The stack of the gate electrode 272 and the gate dielectric 271 may be formed by, for example, a process including (i) sequentially depositing a gate dielectric layer (not shown) and a gate electrode layer (not shown), and (ii) patterning the gate dielectric layer and the gate electrode layer to form the gate dielectric 271 and the gate electrode 272 using a photolithography process and an etching process similar to those described in step 101. The spacers 273 may be formed by, for example, a process including (i) depositing a spacer-forming layer over the stack of the gate electrode 272 and the gate dielectric 271, and (ii) anisotropically etching the spacer-forming layer. In some embodiments, the stack of the gate dielectric 271 and the gate electrode 272 may be formed over a portion of the STI region 22, a portion of the anti-type doping layer 23, the second surface portion 211b of the drift region 211, and a part 212a1 of the first surface portion 212a of the well region 212. Other suitable processes may be also used for forming the gate structure 27.

Figure 9:
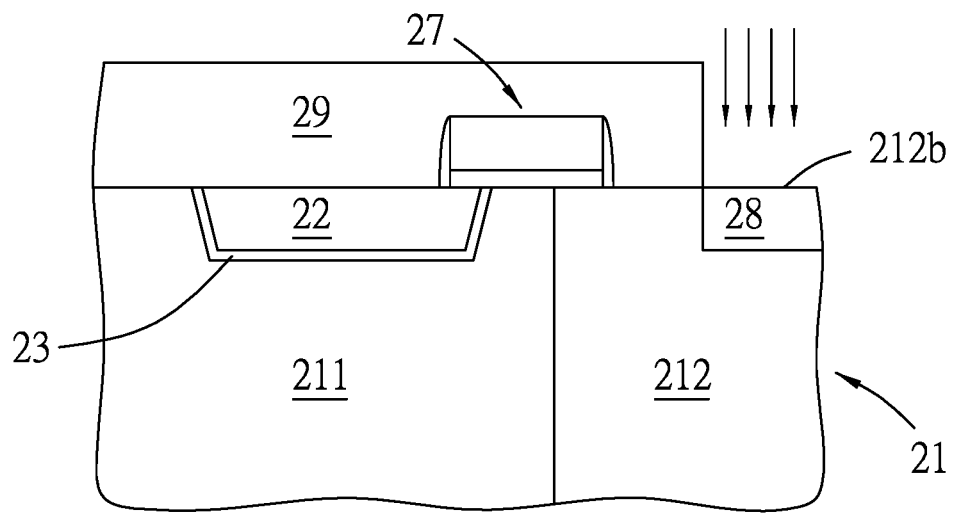

Referring to FIGS. 1 and 9, the method 100 proceeds to step 108, where a body contact 28 is formed in the well region 212. Step 108 may be implemented by (i) forming a patterned mask 29 on the semiconductor layer 21 to expose the second surface portion 212b of the well region 212, and (ii) doping the well region 212 through the patterned mask 29 using an ion implantation process or other suitable processes so as to form the body contact 28 within the well region 212. After step 108, the patterned mask 29 may be removed. In some embodiments, the body contact 28 has the second type conductivity, and thus may have a higher doping concentration than that of the well region 212. Therefore, the body contact 28 may be formed using the above-mentioned P-type dopant for forming the N-type MOS device, or using the above-mentioned N-type dopant for forming the P-type MOS device. In alternative embodiments, the patterned mask 29 may be replaced by a patterned photoresist. Other suitable processes may be also used for forming the body contact 28.

Figure 10:
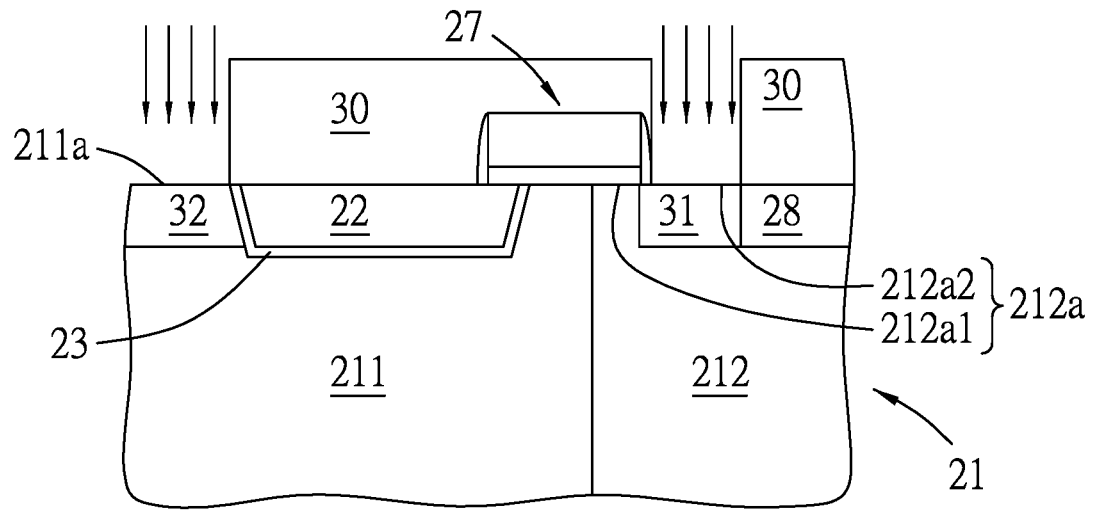

Referring to FIGS. 1 and 10, the method 100 proceeds to step 109, where a source area 31 and a drain area 32 are respectively formed within the well region 212 and the drift region 211 and may have a doping concentration higher than that of the anti-type doping layer 23. Step 109 may be implemented by (i) forming a patterned mask 30 on the semiconductor layer 21 to expose a remaining part 212a2 of the first surface portion 212a of the well region 212 and to expose the first surface portion 211a of the drift region 211, and (ii) doping the well region 212 and the drift region 211 through the patterned mask 30 using an ion implantation process or other suitable processes so as to form the source area 31 within the well region 212 and the drain area 32 within the drift region 211. After step 109, the patterned mask 30 may be removed. In some embodiments, the source area 31 and the drain area 32 have the first type conductivity, and thus may be formed using the above-mentioned N-type dopant for forming the N-type MOS device, or using the above-mentioned P-type dopant for forming the P-type MOS device. In alternative embodiments, the patterned mask 30 may be replaced by a patterned photoresist. Other suitable processes may be also used for forming the source area 31 and the drain area 32.

Figure 11:
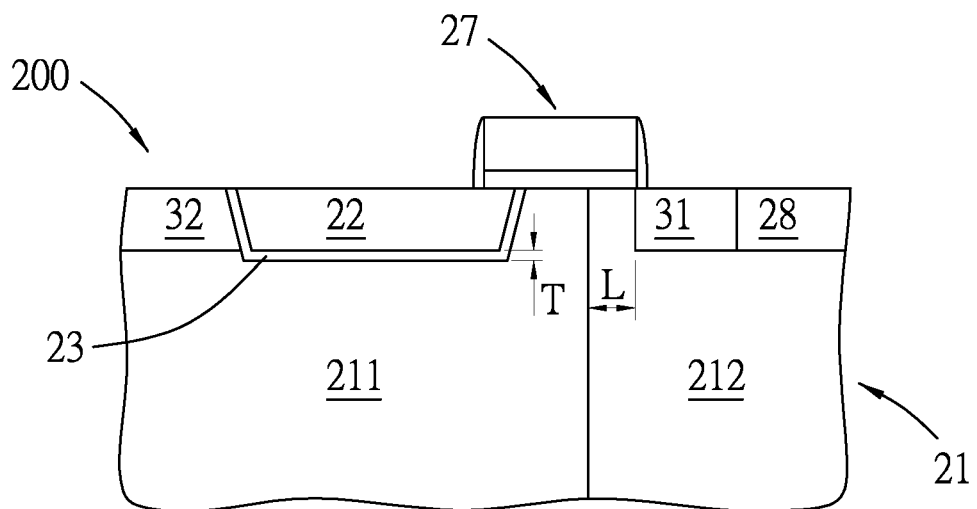

Referring to FIG. 11, after removing the patterned mask 30, a semiconductor device 200 is obtained and a channel length (L) is defined by a distance between the drift region 211 and the source area 31. The anti-type doping layer 23 is located between the drift region 211 and the STI region 22. The STI region 22 is located between the source area 31 and the drain area 32. The well region 212 is disposed to separate the source area 31 and the body contact 28 from the drift region 211.

In some embodiments, in the semiconductor device 200, the doping concentration of the anti-type doping layer 23 may be higher than that of the drift region 211 by two orders of magnitude and may be lower than that of the drain area 32 by two orders of magnitude. For example, when the doping concentration of the anti-type doping layer 23 ranges from about $1\times10^{18}$ atom/cm 3 to about $1\times10^{19}$ atom/cm$^3$, the doping concentration of the drift region 211 may range from about $1\times10^{16}$ atom/cm 3 to about $1\times10^{17}$ atom/cm$^3$, and the doping concentration of the drain area 32 may range from about $1\times10^{20}$ atom/cm$^3$ to about $1\times10^{21}$ atom/cm$^3$. In some embodiments, steps 101 to 109 may not be performed in the above order. In alternative embodiments, other suitable methods may also be applied for forming the semiconductor device 200. In yet alternative embodiments, additional features may be added in the semiconductor device 200, and some features in the semiconductor device 200 may be modified, replaced, or eliminated without departure of the spirit and scope of the present disclosure.

In the semiconductor device 200, dielectric damages (electron trapping) may be induced by certain operations or process fabrications, and may be formed on a bottom wall and/or sidewalls of the dielectric film (STI region) 22. During a reading operation, an on-current flows from the source area 31, through the well region 212 and the drift region 211, and then into the drain area 32. When the anti-type doping layer 23 is not provided, the electron trapping may produce coulomb forces affecting the mobility of the electrons of the on-current. Although this disclosure is not bound by any theory, it is believed that in the semiconductor device 200, because the anti-type doping layer 23 with the thickness (T) is provided underneath the dielectric film 22 and has a conductivity type opposite to that of the drift region 211, a current path of an on-current in the drift region 211 may be changed, for example, to flow away from the dielectric film 22. Therefore, the on-current is less likely to be influenced by coulomb forces of the electron trapping (i.e., the influence of the dielectric damages on the on-current is reduced), and the semiconductor device 200 may have improved operation performance and reliability.

In alternative embodiments, a doping layer (which may be also exemplified as the anti-type doping layer 23) is formed between a semiconductor region (which may be also exemplified as the drift region 211) and a dielectric film (which may be also exemplified as the STI region 22), and has a conductivity type to direct a current path away from the dielectric film, thereby reducing an influence of dielectric damages of the dielectric film on the semiconductor region.

Figure 12:
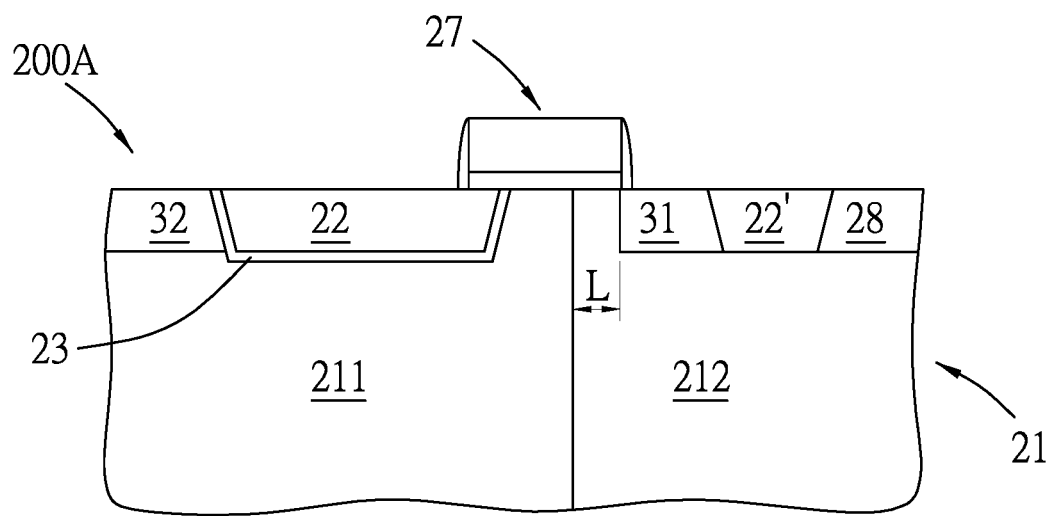
FIG. 12 is a schematic view of a semiconductor device in accordance with some embodiments.

FIG. 12 illustrates a schematic view of a semiconductor device 200A in accordance with some embodiments. The semiconductor device 200A is similar to the semiconductor device 200 except that, in the semiconductor device 200A, an additional STI region 22' is formed between the source area 31 and the body contact 28 to isolate the source area 31 from the body contact 28.

The semiconductor device 200A may be made using a method 100A similar to the method 100 except for steps 101, 102, 103, and 106. FIGS. 13 to 16 illustrate schematic views of the intermediate stages in steps 101, 102, 103, and 106 of the method 100A.

Figure 13:
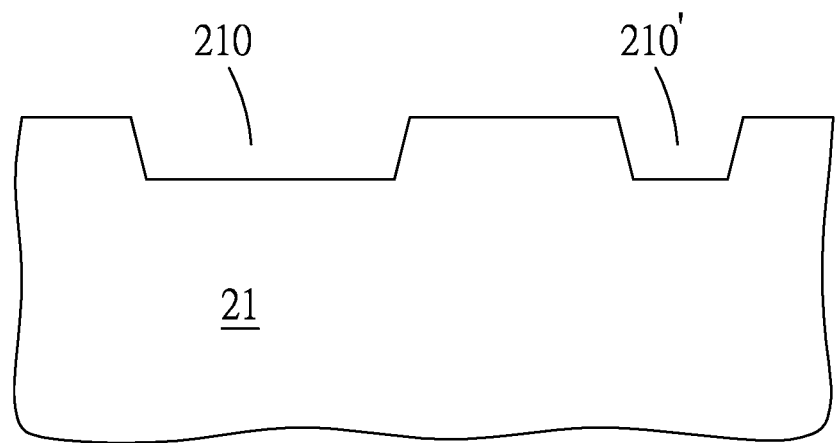
FIG. 13 is a schematic view illustrating an intermediate stage of a method for manufacturing the semiconductor device shown in FIG. 12 in accordance with some embodiments.

Referring to FIG. 13, the method 100A begins at step 101, where a trench 210 and a trench 210' are formed in the semiconductor layer 21. The formation of the trenches 210, 210' is similar to that described in step 101 of the method 100, and the details thereof are omitted for the sake of brevity.

Figure 14:
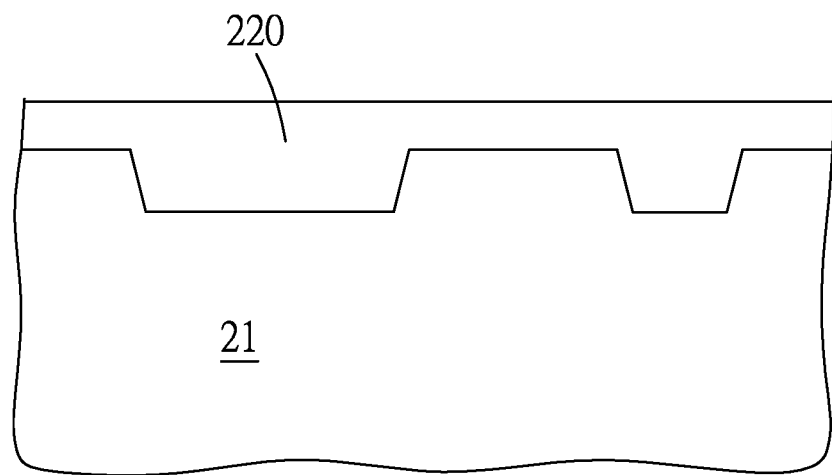
FIG. 14 is a schematic view of a semiconductor device in accordance with some embodiments.

Referring to FIG. 14, the method 100A proceeds to step 102, a dielectric layer 220 is formed on the semiconductor layer 21 to fill the trenches 210, 210' shown in FIG. 13. The materials and formation for the dielectric layer 220 are similar to those described in step 102 of the method 100, and the details thereof are omitted for the sake of brevity.

Figure 15:
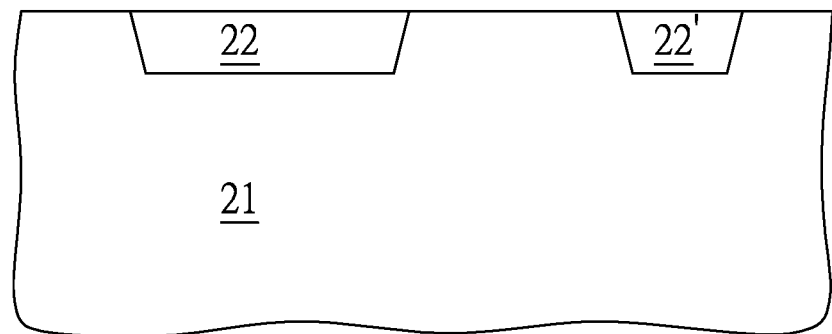
FIGS. 15 to 18 are schematic views illustrating intermediate stages of a method for manufacturing the semiconductor device shown in FIG. 14 in accordance with some embodiments.

Referring to FIG. 15, the method 100A proceeds to step 103, where a planarization process is conducted to remove an excess of the dielectric layer 220 shown in FIG. 14, to expose the semiconductor layer 21 so as to obtain the STI region 22 and the additional STI region 22'. The planarization process may be similar to that described in step 103 of the method 100, and the details thereof are omitted for the sake of brevity.

Figure 16:
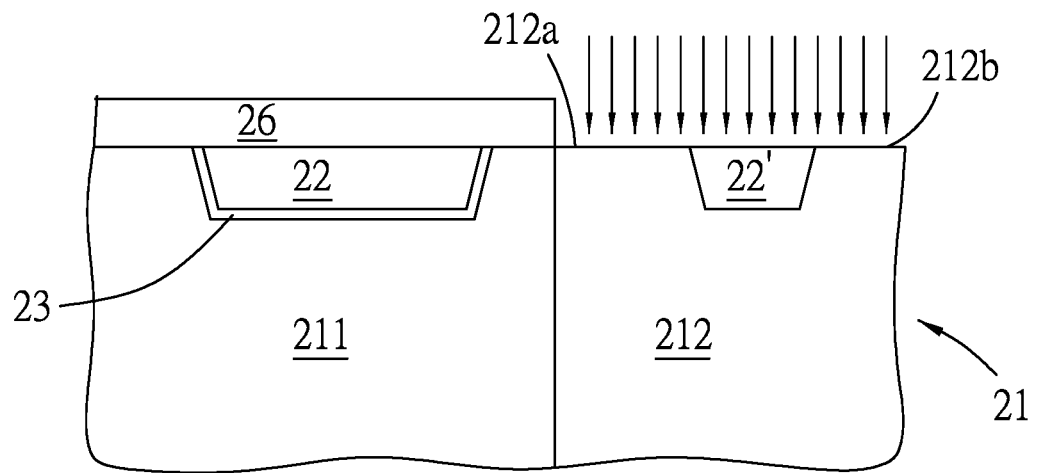

Referring to FIG. 16, the method 100A proceeds to step 106, where the well region 212 is formed in the semiconductor layer 21 to have a first surface portion 212a and a second surface portion 212b at two opposite sides of the additional STI region 22'. Step 106 of the method 100A may be similar to step 106 of the method 100, and the details thereof are omitted for the sake of brevity.

In alternative embodiments, other suitable methods may also be applied for forming the semiconductor device 200A. In yet alternative embodiments, additional features may be added in the semiconductor device 200A, and some features in the semiconductor device 200A may be modified, replaced, or eliminated without departure of the spirit and scope of the present disclosure.

Figure 17:
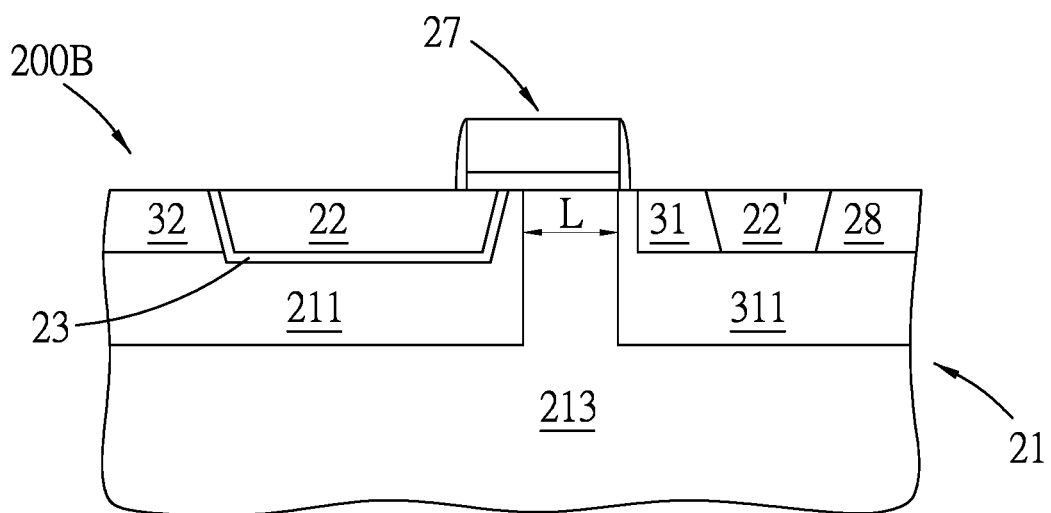

FIG. 17 illustrates a schematic view of a semiconductor device 200B in accordance with some embodiments. The semiconductor device 200B is similar to the semiconductor device 200A except that, in the semiconductor device 200B, a drift region 211 and a lightly doped source region 311 are formed within the semiconductor layer 21, and a remaining part of the semiconductor layer 21 serves as a well region 213. The well region 213 is located between the lightly doped source region 311 and the drift region 211. In addition, a channel length (L) is defined by a distance between the lightly doped source region 311 and the drift region 211. The lightly doped source region 311 may have the first type conductivity, and may have a doping concentration lower than that of the source area 31. The well region 213 has the second type conductivity. The lightly doped source region 311 is disposed to separate the source area 31 and the body contact 28 from the well region 213.

The semiconductor device 200B may be made using a method 100B similar to the method 100A except that in the method 100B: (i) the semiconductor layer 21 may be lightly doped to have a P-type conductivity for the N-type MOS device or to have an N-type conductivity for the P-type MOS device; (ii) in step 105, the drift region 211, the lightly doped source region 311, and the well region 213 may be formed simultaneously; and (iii) step 106 may be omitted.

Figure 18:
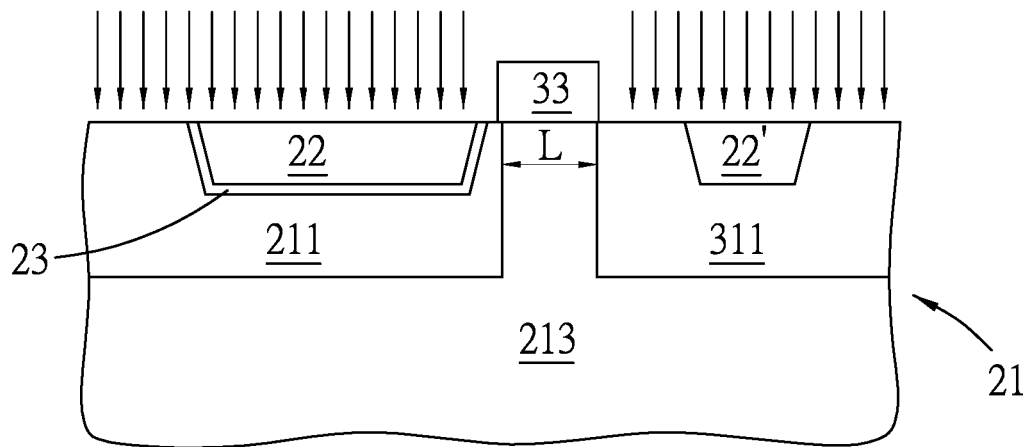

FIG. 18 illustrates a schematic view of the intermediate stage in step 105 of the method 100B. In step 105 of the method 100B, the drift region 211 and the lightly doped source region 311 may be formed simultaneously by (i) forming a patterned mask 33 on the semiconductor layer 21 to permit the patterned mask 33 to be spaced apart from the STI region 22 and the anti-type doping layer 23 by a predetermined distance, and (ii) doping the semiconductor layer 21 through the patterned mask 33 using an ion implantation process or other suitable processes so as to form the drift region 211 and the lightly doped source region 311 at two opposite sides of the patterned mask 33. After step 105 of the method 100B, the patterned mask 33 may be removed, and a remaining part of the semiconductor layer 21 may serve as the well region 213. In alternative embodiments, the patterned mask 33 may be replaced by a patterned photoresist.

In alternative embodiments, other suitable methods may also be applied for forming the semiconductor device 200B. In yet alternative embodiments, additional features may be added in the semiconductor device 200B, and some features in the semiconductor device 200B may be modified, replaced, or eliminated without departure of the spirit and scope of the present disclosure.

Figure 19:
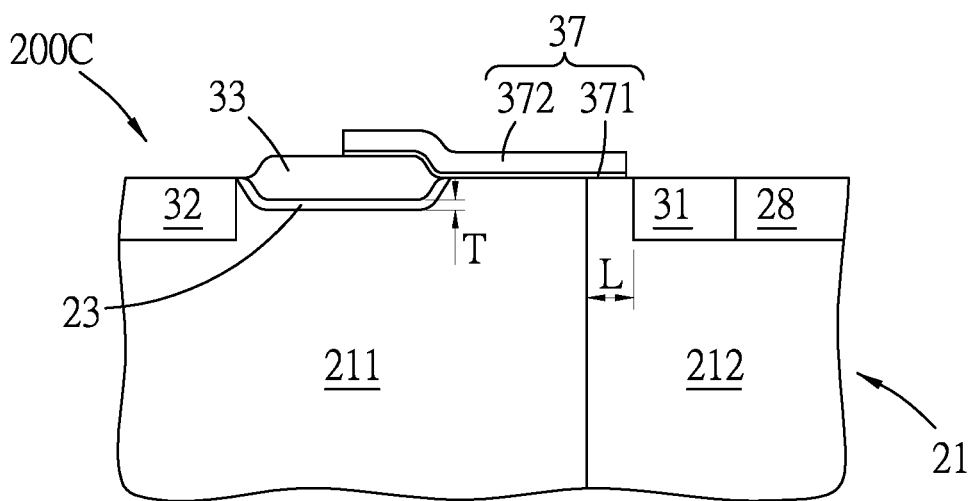
FIG. 19 is a schematic view of a semiconductor device in accordance with some embodiments.

FIG. 19 illustrates a schematic view of a semiconductor device 200C in accordance with some embodiments. The semiconductor device 200C is similar to the semiconductor device 200 except that in the semiconductor device 200C, a dielectric film (field oxide region) 33 and a gate structure 37 are formed to replace the STI region 22 and the gate structure 27 of the semiconductor device 200, respectively.

Figure 20:
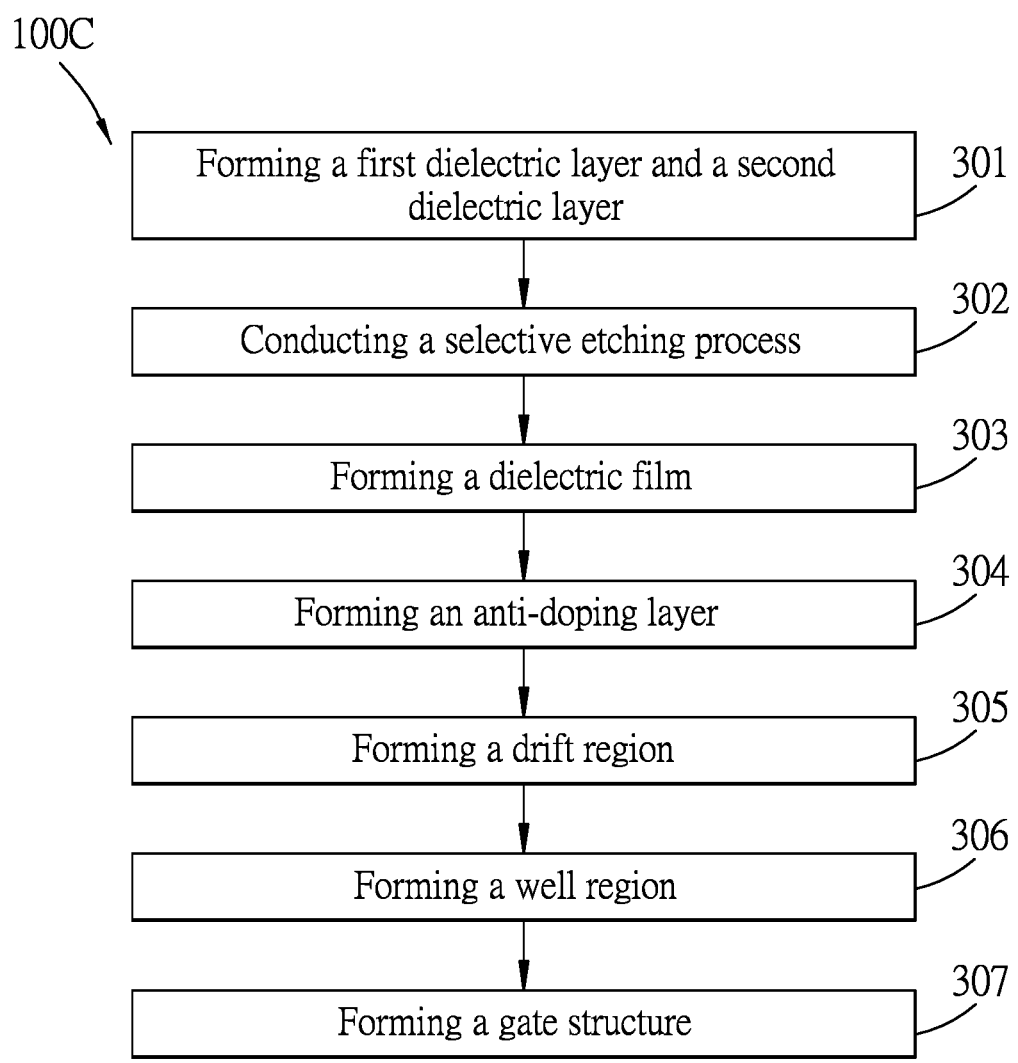
FIG. 20 is a flow diagram illustrating a method for manufacturing a semiconductor device in accordance with some embodiments.

The semiconductor device 200C may be made using a method 100C similar to the method 100 except that in the method 100C, steps 301 to 307 are used for replacement of steps 101 to 107 of the method 100. FIG. 20 is a flow diagram illustrating steps 301 to 307 of the method 100C in accordance with some embodiments. FIGS. 21 to 28 illustrate schematic views of the intermediate stages of the method 100C.

Figure 21:
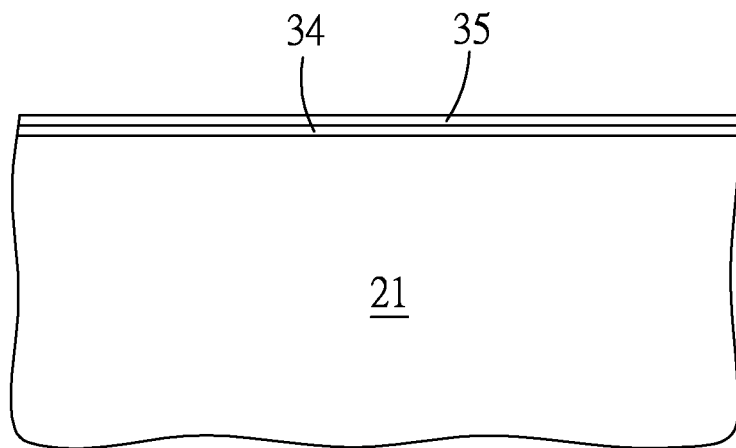
FIGS. 21 to 27 illustrate schematic views of intermediate stages of a method for manufacturing a semiconductor device in accordance with some embodiments as depicted in FIG. 20.

Referring to FIGS. 20 and 21, the method 100C begins at step 301, where a first dielectric layer 34 and a second dielectric layer 35 are sequentially formed over a semiconductor layer 21. The materials for the semiconductor layer 21 is similar to those described in step 101, and the details thereof are omitted for the sake of brevity. In some embodiments, the first dielectric layer 34 may be formed by deposition similar to that for the dielectric layer 220 described in step 102, and/or by a thermal oxidation process which may implemented by introducing a thermal vapor to oxidize a surface of the semiconductor layer 21. In some embodiments, the second dielectric layer 35 has a material different from that of the first dielectric layer 34, and may be formed by deposition similar to that for the dielectric layer 220 described in step 102. Other suitable processes may be used for formation of the first dielectric layer 34 and the second dielectric layer 35.

Figure 22:
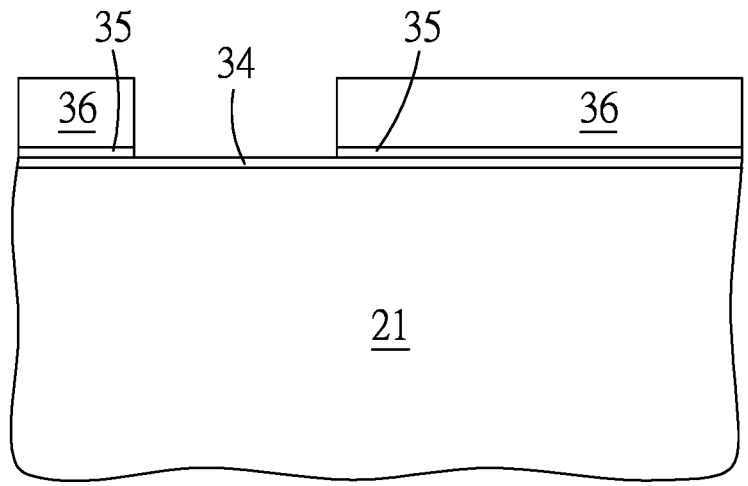

Referring to FIGS. 20 and 22, the method 100C proceeds to step 302, where a selective etching process is conducted through a patterned photomask 36 to partially and selectively etching the second dielectric layer 35 and to expose a portion of the dielectric layer 34. Step 302 may be implemented using, for example, but not limited to, a dry etching process, a wet etching process, other suitable processes, or combinations thereof. In alternative embodiments, the patterned photomask 36 may be replaced by a patterned mask layer.

Figure 23:
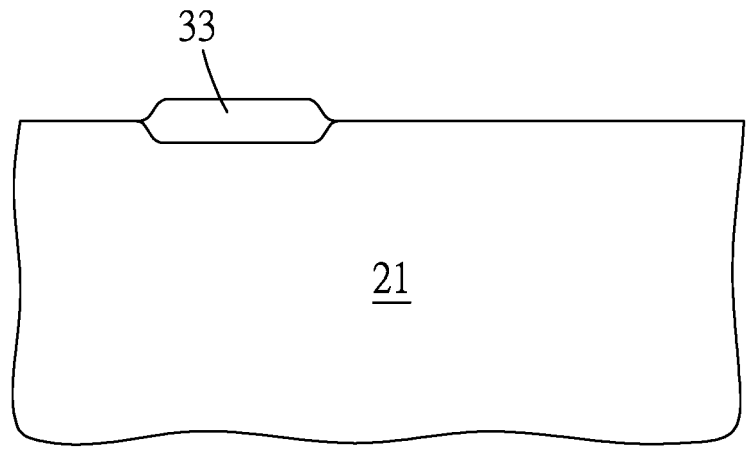

Referring to FIGS. 20 and 23, the method 100C proceeds to step 303, where a dielectric film 33 is formed in replacement of the exposed portion of the first dielectric layer 34. The dielectric film 33 may include a dielectric material similar to those for the dielectric layer 220 described in step 102, but the material of the dielectric film 33 is different from those of the first dielectric layer 34 and the second dielectric layer 35. Step 303 may be implemented by (i) removing the patterned mask layer 36 shown in FIG. 22 using an etchant which also etches the exposed portion of the first dielectric layer 34 and the semiconductor layer 21 beneath the first dielectric layer 34 to expose a portion of the semiconductor layer 21, (ii) forming the dielectric film 33 on the exposed portion of the semiconductor layer 21 (which is not covered by the second dielectric layer 35), and (iii) removing the second dielectric layer 35 and the remaining first dielectric layer 34. Other suitable processes may be used for formation of the dielectric film 33. The dielectric film 33 may be also referred to as a field oxide (FOX) region.

Figure 24:
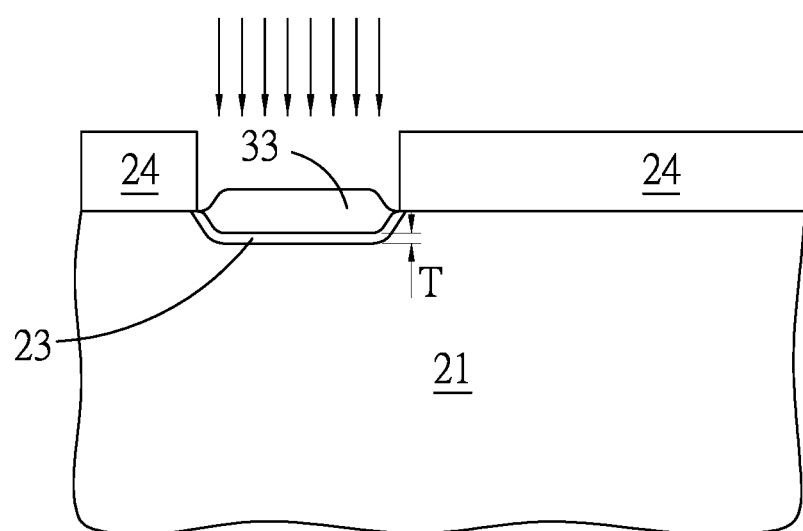

Referring to FIGS. 20 and 24, the method 100C proceeds to step 304, where an anti-type doping layer 23 is formed beneath the FOX region 33 using a patterned mask 24. The formation of the anti-type doping layer 23 in step 304 may be similar to that described in step 104, and the details thereof are omitted for the sake of brevity.

Figure 25:
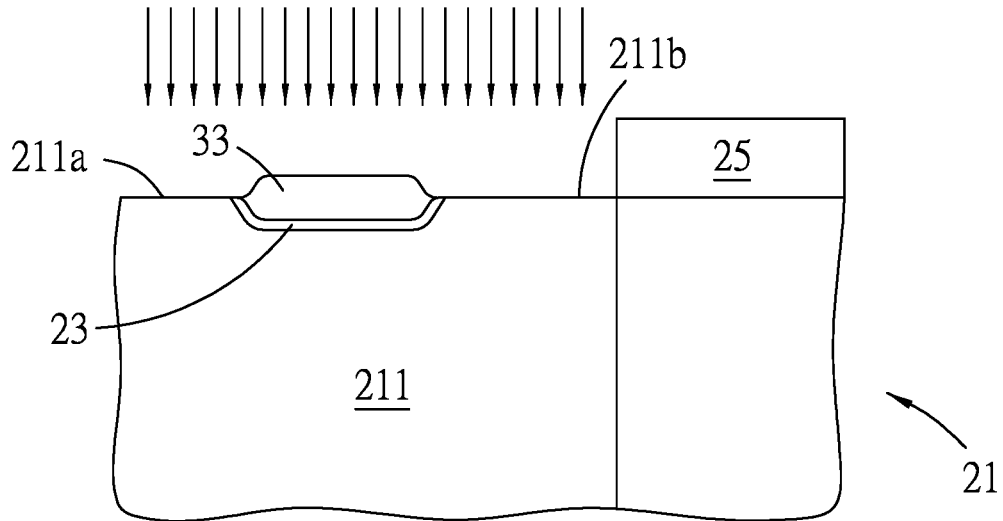

Referring to FIGS. 20 and 25, the method 100C proceeds to step 305, where a drift region 211 is formed in the semiconductor layer 21 using a patterned mask 25. Step 305 may be implemented in a manner similar to step 105, and the details thereof are omitted for the sake of brevity. After step 305, an upper surface of the drift region 211 may have a first surface portion 211a and a second surface portion 211b which are located at two opposite sides of the FOX region 33 and the anti-type doping layer 23.

Figure 26:
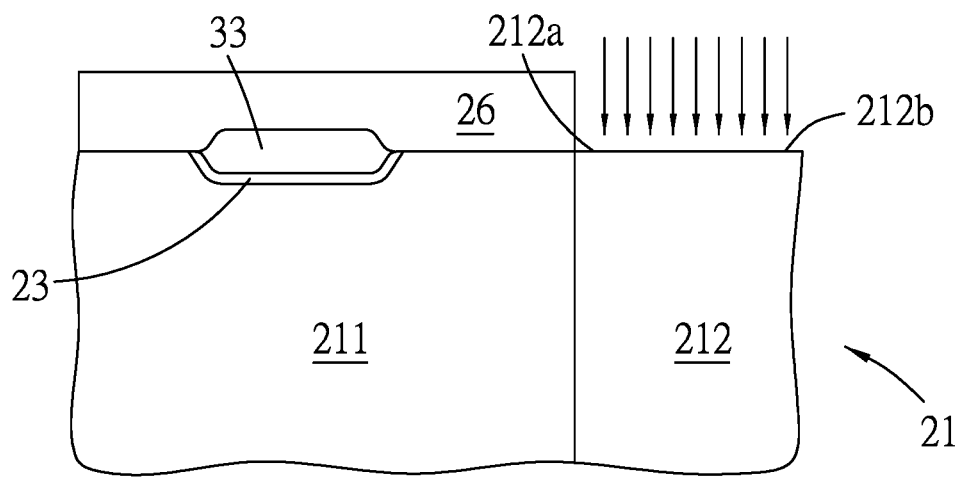

Referring to FIGS. 20 and 26, the method 100C proceeds to step 306, where a well region 212 is formed in the semiconductor layer 21. Step 306 may be implemented in a manner similar to step 106, and the details thereof are omitted for the sake of brevity. After step 306, an upper surface of the well region 212 may have a first surface portion 212a and a second surface portion 212b which are proximate to and distal from the FOX region 33, respectively.

Figure 27:
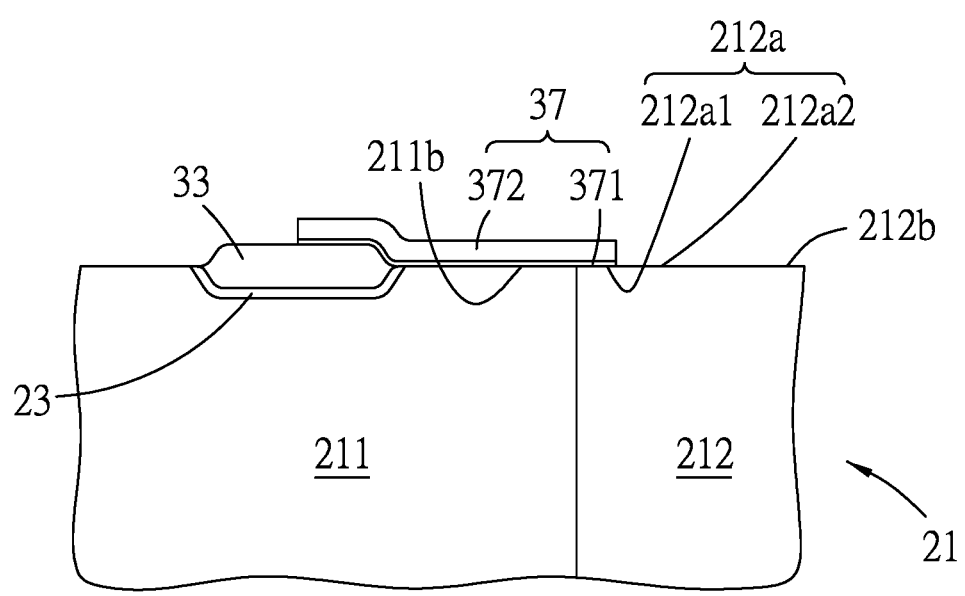

Referring to FIGS. 20 and 27, the method 100C proceeds to step 307, where a gate structure 37 is formed on the semiconductor layer 21. The gate structure 37 include s a gate dielectric 371 formed on the semiconductor layer 21 and a gate electrode 372 formed on the gate dielectric 371. The materials and formation for the gate dielectric 371 and the gate electrode 372 may be similar to those for the gate dielectric 271 and the gate electrode 272 described in step 107, and the details thereof are omitted for the sake of brevity. In some embodiments, the gate structure 37 may be formed over a portion of the FOX region 33, a portion of the anti-type doping layer 23, the second surface portion 211b of the drift region 211, and a part 212a1 of the first surface portion 212a of the well region 212. The subsequent steps for manufacturing the semiconductor device 200C may be similar to steps 108 and 109, and are omitted for the sake of brevity.

In some embodiments, the steps for manufacturing the semiconductor device 200C may not be performed in the above order. In alternative embodiments, other suitable methods may also be applied for forming the semiconductor device 200C. In yet alternative embodiments, additional features may be added in the semiconductor device 200C, and some features in the semiconductor device 200C may be modified, replaced, or eliminated without departure of the spirit and scope of the present disclosure.

In the semiconductor device 200, 200A, 200B, 200C of this disclosure, because the anti-type doping layer 23 is provided between the drift region 211 and the dielectric film 35 (the STI region 22 or the FOX region 33) and has a conductivity type opposite to that of the drift region 211, a current in the drift region 211 is less likely to be influenced by dielectric damages (if any) of the dielectric film 22 or 23. Therefore, the semiconductor device 200, 200A, 200B, 200C of this disclosure may have improved performance, such as improved reliability, less leakage current, and so on. In addition, the formation of the anti-type doping layer 23 may be implanted simply after formation of the dielectric film 22 or 33, and may not influence formation of other elements in the semiconductor device 200, 200A, 200B, 200C. In alternative embodiments of this disclose, a doping layer (which may be also exemplified as the anti-type doping layer 23) may be provided to direct a current path in a semiconductor region (which may be also exemplified as the drift region 211) away from a dielectric film (which may be also exemplified as the STI region 22 or the FOX region 33), thereby reducing an influence of dielectric damages of the dielectric film on the semiconductor region.

In accordance with some embodiments of the present disclosure, a semiconductor device includes a drift region, a dielectric film, and an anti-type doping layer. The drift region has a first type conductivity. The anti-type doping layer is located between the drift region and the dielectric film, and has a second type conductivity opposite to the first type conductivity so as to change a current path of a current in the drift region, to thereby prevent the current from being influenced by the dielectric film.

In accordance with some embodiments of the present disclosure, a method for manufacturing a semiconductor device includes: forming a dielectric film in a semiconductor layer; forming an anti-type doping layer in the semiconductor layer beneath the dielectric film; and forming a drift region in the semiconductor layer such that the anti-type doping layer is located between the dielectric film and the drift region. The drift region has a first type conductivity and the anti-type doping layer has a second type conductivity opposite to the first type conductivity.

In accordance with some embodiments of the present disclosure, a method for reducing an influence of a dielectric film on a semiconductor region is provided. The method includes forming a doping layer which is located between the semiconductor region and the dielectric film and which has a conductivity type so as to direct a current path away from the dielectric film, thereby reducing the influence of the dielectric film.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device comprising:
   forming a trench in a semiconductor layer;
   forming a dielectric film in the trench;
   forming an anti-type doping layer beneath the dielectric film;
   forming a drift region in the semiconductor layer in a way that the anti-type doping layer is located between the drift region and the dielectric film, the drift region having a first conductivity type opposite to a second conductivity type of the anti-type doping layer; and
   forming a drain area within a portion of the drift region, the drain area having the first type conductivity and having a doping concentration higher than a doping concentration of the drift region,
   the anti-type doping layer being disposed to entirely separate the drift region and the drain area from the dielectric film.

2. The method of claim 1, wherein the semiconductor layer includes crystalline silicon, polycrystalline silicon, or a combination thereof.

3. The method of claim 1, wherein formation of the dielectric film includes
   forming a dielectric layer on the semiconductor layer to fill the trench,
   removing an excess of the dielectric layer to expose the semiconductor layer so as to form the dielectric layer into the dielectric film.

4. The method of claim 1, wherein formation of the anti-type doping layer includes
   forming a patterned mask on the semiconductor layer to expose the dielectric film and a surrounding surface of the semiconductor layer around the dielectric film,
   doping a region beneath the dielectric film through the patterned mask using an ion implantation process so as to form the anti-type doping layer.

5. The method of claim 1, wherein the anti-type doping layer has a thickness ranging from 50 Å to 200 Å.

6. The method of claim 1, wherein the anti-type doping layer has a doping concentration higher than the doping concentration of the drift region.

7. The method of claim 1, wherein the anti-type doping layer has a doping concentration lower than the doping concentration of the drain area.

8. The method of claim 7, wherein the doping concentration of the anti-type doping layer is higher than the doping concentration of the drain area by two orders of magnitude.

9. A method for manufacturing a semiconductor device comprising:
 forming a trench in a semiconductor layer;
 forming a dielectric film in the trench;
 forming an anti-type doping layer beneath the dielectric film;
 forming a drift region in the semiconductor layer in a way that the anti-type doping layer is located between the drift region and the dielectric film, the drift region having a first conductivity type opposite to a second conductivity type of the anti-type doping layer;
 forming a drain area within a portion of the drift region, the drain area having the first type conductivity and having a doping concentration higher than a doping concentration of the drift region; and
 forming a source area in the semiconductor layer in a way that the dielectric film is located between the source area and the drain area, the source area having the first conductivity type,
 the anti-type doping layer being disposed to entirely separate the drift region and the drain area from the dielectric film.

10. The method of claim 9, wherein the semiconductor layer includes crystalline silicon, polycrystalline silicon, or a combination thereof.

11. The method of claim 9, wherein formation of the dielectric film includes
 forming a dielectric layer on the semiconductor layer to fill the trench,
 removing an excess of the dielectric layer to expose the semiconductor layer so as to form the dielectric layer into the dielectric film.

12. The method of claim 9, wherein formation of the anti-type doping layer includes
 forming a patterned mask on the semiconductor layer to expose the dielectric film and a surrounding surface of the semiconductor layer around the dielectric film,
 doping a region beneath the dielectric film through the patterned mask using an ion implantation process so as to form the anti-type doping layer.

13. The method of claim 9, wherein the anti-type doping layer has a thickness ranging from 50 Å to 200 Å.

14. The method of claim 1, wherein the anti-type doping layer has a doping concentration higher than the doping concentration of the drift region.

15. The method of claim 9, wherein the anti-type doping layer has a doping concentration lower than the doping concentration of the drain area.

16. The method of claim 15, wherein the doping concentration of the anti-type doping layer is higher than the doping concentration of the drain area by two orders of magnitude.

17. A method for manufacturing a semiconductor device comprising:
 forming a trench in a semiconductor layer;
 forming a dielectric film in the trench;
 forming an anti-type doping layer beneath the dielectric film;
 forming a drift region in the semiconductor layer in a way that the anti-type doping layer is located between the drift region and the dielectric film, the drift region having a first conductivity type opposite to a second conductivity type of the anti-type doping layer;
 forming a drain area within a portion of the drift region, the drain area having the first type conductivity and having a doping concentration higher than a doping concentration of the drift region;
 forming a source area in the semiconductor layer in a way that the dielectric film is located between the source area and the drain area, the source area having the first conductivity type; and
 forming a well region in the semiconductor layer in a way that the well region is located to separate the source area from the drift region, the well region having the second type conductivity,
 the anti-type doping layer being disposed to entirely separate the drift region and the drain area from the dielectric film.

18. The method of claim 17, further comprising forming a gate structure over a portion of the dielectric film, a portion of the anti-type doping layer, a portion of the drift region, and a portion of the well region.

19. The method of claim 18, wherein the gate structure includes a gate electrode and a gate dielectric located beneath the gate electrode.

20. The method of claim 17, wherein the gate structure further includes two spacers formed at two opposite sides of a stack of the gate electrode and the gate dielectric.

* * * * *